United States Patent [19]
Aue et al.

[11] Patent Number: 4,754,163
[45] Date of Patent: Jun. 28, 1988

[54] PULSE GENERATOR WITH ADJUSTABLE PULSE FREQUENCY, PULSE WIDTH AND PULSE DELAY

[75] Inventors: Peter Aue, Böblingen; Michael Fleischer, Nufringen; Friedhelm Brilhaus, Böblingen, all of Fed. Rep. of Germany

[73] Assignee: Hewlett-Packard Company, Palo Alto, Calif.

[21] Appl. No.: 625,982

[22] Filed: Jun. 29, 1984

[30] Foreign Application Priority Data

Jul. 8, 1983 [DE] Fed. Rep. of Germany ....... 3324711

[51] Int. Cl.$^4$ ...................... H03K 3/017; H03K 5/04; H03K 23/66; G05F 5/00
[52] U.S. Cl. ..................................... 307/265; 307/510; 328/58; 377/27; 377/39; 377/44; 377/110
[58] Field of Search .................. 307/265, 510; 328/58; 377/39, 44, 52, 27, 107, 110

[56] References Cited

U.S. PATENT DOCUMENTS

| 2,616,047 | 10/1952 | Boothroyd | 328/58 |
| 3,192,408 | 5/1965 | Cho | 328/58 |
| 3,745,380 | 7/1973 | Kitajima et al. | 307/260 |
| 4,231,104 | 10/1980 | St. Clair | 364/900 |
| 4,415,861 | 11/1983 | Palmquist | 307/265 |
| 4,566,111 | 1/1986 | Taragawa | 377/39 |
| 4,599,569 | 7/1986 | Furuhata et al. | 307/265 |

FOREIGN PATENT DOCUMENTS 3221211 1/1983 Fed. Rep. of Germany .

OTHER PUBLICATIONS

Valvo, Techn. Informationen fur Die Industrie, TI 67, 1964, pp. 3 to 5.
Electronik, 1975, vol. 11, pp. 99 to 101.
Electronics, Jan. 20, 1977, p.98.
Electronicpraxis, No. 1, Jan. 1983, p. 96.
Elektronik, 1978, vol. 10, pp. 87 to 88.

Primary Examiner—John S. Heyman
Assistant Examiner—M. R. Wambach
Attorney, Agent, or Firm—John A. Frazzini

[57] ABSTRACT

A pulse generator with adjustable pulse frequency, pulse width and pulse delay contains a start-stop oscillator (1) whose oscillator pulses are counted by a counter (2) in adjustable counting cycles. After each counting cycle, the oscillator (1) is shut down for an adjustable time interval. The pulses of the output signal of the pulse generator are produced at the occurrence of a predetermined count value, and the end of these pulses is essentially determined by a second predetermined count value. As the oscillator (1) has a fixed operating frequency and for the purpose of frequency interpolation is periodically shut down during short time intervals and then restarted, a pulse generator is obtained having very small frequency deviations over a wide frequency spectrum.

4 Claims, 3 Drawing Sheets

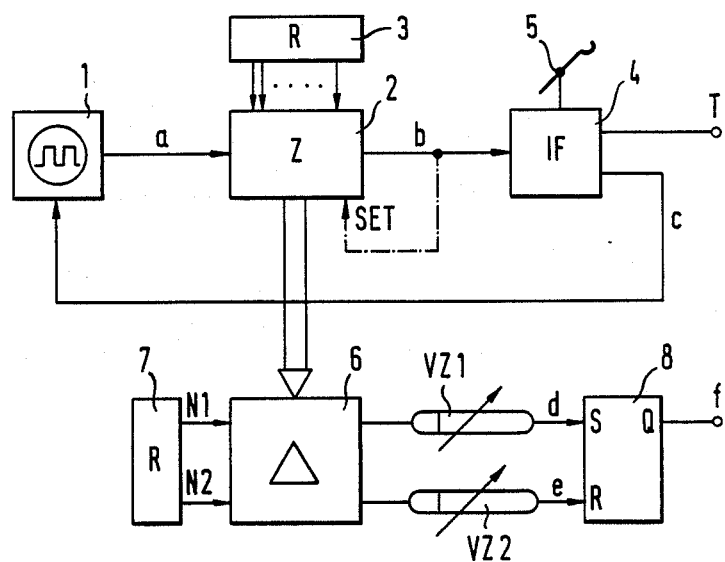
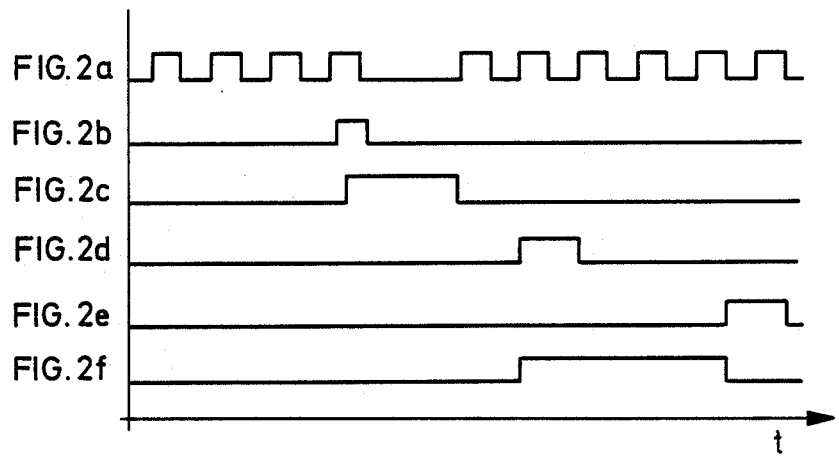

PULSE GENERATOR WITH ADJUSTABLE PULSE FREQUENCY, PULSE WIDTH AND PULSE DELAY

BACKGROUND AND SUMMARY OF THE INVENTION

The invention relates in general to pulse generators, and more particularly to a pulse generator having an accurately selectable output frequency. Pulse generators are used as measuring signal sources for the generation of pulses with selectable repetition frequency and width, and with adjustable delay relative to a trigger signal.

Known pulse generators use an oscillator to produce an output signal having a frequency that is an integral fraction of the oscillator frequency. The integral ratio is selectable over a range of integer values to vary the frequency in discrete steps. In order to set the pulse generator to frequencies between these discrete values, these pulse generators use oscillators whose frequencies are adjustable in response to a control voltage. However, this type of analog frequency variation causes a frequency inaccuracy of several percent.

In accordance with the illustrated preferred embodiment, a pulse generator is presented which allows a highly precise continuous adjustment of the frequency, pulse width and pulse delay of the pulse generator output signal. The pulse generator uses a start-stop oscillator having a control input for stopping the oscillator in response to a stop pulse. During the duration of the stop pulse, the output of the oscillator remains at a logical "0" voltage. At the end of the stop pulse the oscillator is restarted. By adjusting the duration of the stop pulse, the delay time is adjusted to delay the leading edge of the first pulse following the stop pulse. The stop pulse occurs when a predetermined number of oscillator pulses have been counted. The output signal of the pulse generator is derived from the count values in such a way that at the occurrence of a predetermined count value an output pulse is started which continues until a second adjustable count value is reached. By the selection of the two count values the pulse delay and the pulse width of the output signal are selected.

The surveillance of the count values is accomplished by use of a pair of comparators, each of which compares the instantaneous count value with as associated stored nominal value. The output pulse is started when the count value equals the nominal value associated with the first comparator and is stopped when the count value equals the nominal value associated with the second comparator. Fine adjustment of the pulse delay and pulse width are obtained by adjustable delay lines connected to the outputs of the comparators for delaying the beginning and the end of the output pulse to the extent desired.

With the pulse generator according to the invention, the parameters of the output signal (i.e. pulse frequency, pulse width, pulse delay) are adjusted with high precision. The total frequency range may extend from the kHz range to several hundred MHz. Without large expenditure, an increase in frequency accuracy is obtained. Furthermore, the pulse generator has a high resolution, even at large values of period, delay and pulse width.

DESCRIPTION OF THE FIGURES

FIG. 1 shows a simplified block diagram of the pulse generator according to the invention.

FIG. 2a to 2f show some of the voltage signals occurring in the pulse generator.

In FIG. 5 is shown a timing diagram illustrating the cooperation of signals in the operation of the circuit of FIG. 3.

DESCRIPTION OF THE PREFERRED EMBODIMENT

Figure 3:
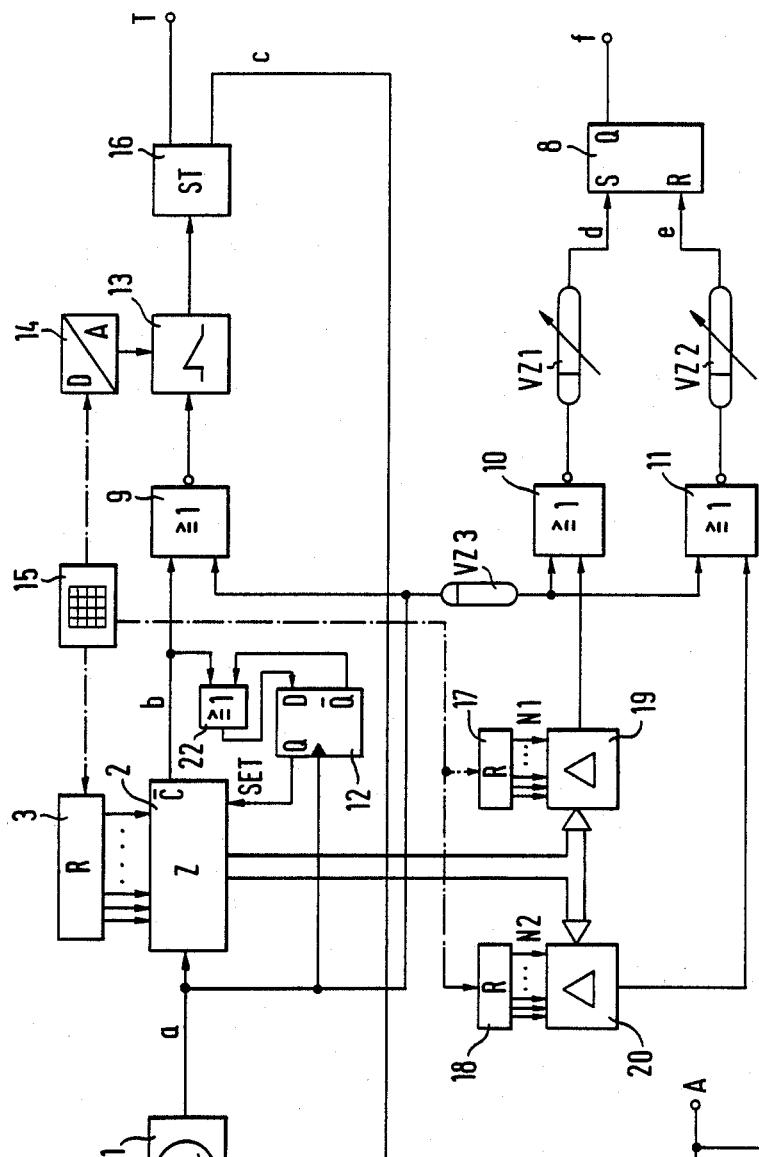
FIG. 3 is a detailed block diagram of a preferred embodiment.

In the pulse generator shown in FIG. 1, a set of internal signals a-e are utilized in producing an output signal f. The time variation and relative timing of signals a-f are shown in FIGS. 2a-2f, respectively. The pulse generator depicted in FIG. 1 contains a start-stop oscillator 1, whose output a is connected to a counter 2. Counter 2 counts a predetermined number of oscillator pulses and then emits a counter pulse b. This counter pulse resets the counter so that a new counting cycle can start. Counter 2 can be, for example, a down counter which, in response to the leading edge of the pulse b is set to a predetermined value contained in a register 3.

Counter pulse b is also applied to a pulse shaper 4 which transmits a stop pulse c from its output to the control input of oscillator 1. The duration of stop pulse c is continuously adjustable by an adjusting means 5. Pulse shaper 4 and adjusting means 5 are presented in greater detail in FIG. 3. Pulse shaper 4 consists of a digital-to-analog converter (DAC) 14, a ramp generator 13 and a Schmitt trigger 16. Adjusting means 5 consists of an input means 15 and DAC 14. Input means sets the value of a register in DAC 14 which determines that value of the analog output signal from DAC 14. This analog signal determines the decay time of ramp signal 4 produced by ramp generator 13. Schmitt trigger 16 converts ramp signal 4 to a stop pulse having a pulse width equal to the ramp decay time. The duration of stop pulse c is usually adjustable within a time interval of one to two periods of the output signal a of oscillator 1. Furthermore, a trigger signal T is derived from pulse shaper 4. During the duration of the stop pulse, oscillator 1 is stopped so that it does not transmit pulses at its output. At the end of stop pulse c the oscillator is started again.

Counter 2 is also connected to a comparator 6, which compares the instantaneous value of counter 2 with a first stored count value N1 and with a second stored count value N2. The two count values N1 and N2 are stored in a register 7 which is connected to comparator 6. When comparator 6 determines that the instantaneous count value of counter 2 is equal to N1 it causes the output of a bistable circuit 8 to be set to a logic voltage "1". When the value of counter 2 is equal to N2 the output of the bistable circuit is set to "0". In the embodiment of FIG. 1, the bistable circuit is a flip-flop 8, the inputs of which are connected to the outputs of the comparator means 6 via adjustable delay lines VZ1 and VZ2. The output signal f of the pulse generator is produced at an output Q of flipflop 8.

The frequency of the output signal is coarsely determined by the count value stored in registor 3. If, for example, a count value 15 is stored is register 3, counter 2 functions as a divider with the dividing ratio of 1:16. The delay of pulse f relative to trigger signal T is coarsely determined in discrete steps by the selection of the stored count value N1. A fine continous adjustment is additionally accomplished by delay line VZ1. The end of the pulses of the output signal f is coarsely determined by the choice of N2, and is finely adjusted by delay line VZ2.

In the embodiment which is shown in more detail in FIG. 3, corresponding assemblies which are already contained in FIG. 1 have the same reference numbers. The block diagram shown in FIG. 3 contains a synchronizing means that compensates for delays in signals a-f introduced by circuit components. The synchronizing means synchronizes certain signal transitions with transitions in oscillator signal a so that circuit delays do not affect the frequency or width of the pulses in output signal f and also do not affect the delay of signal f relative to trigger signal T. The synchronizing means includes NOR gates 9, 10, and 11 and a D flipflop 12.

The operation of the synchronizing means can be understood by reference to the circuit diagram in FIG. 3 and timing diagram in FIG. 5. Oscillator output a is supplied directly to counter 2, the clock input of D flipflop 12 and one of the two inputs of NOR gate 9. Oscillator output a is also supplied through a delay line VZ3 to one input of each of NOR gates 10 and 11. An inverting output $\overline{C}$ of counter 2 is connected to the other input of NOR gate 9 and to one input of an OR gate 22. The inverting output $\overline{Q}$ of flipflop 12 is connected to the other input of OR gate 22. The output Q of flipflop 12 is connected to the set input SET of counter 2. If a "0" is applied to input SET by flipflop 12, counter 2 is set to the value in register 3.

In FIG. 5, the causal effect of some of the signals on other signals is indicated by events (1) to (13). Each of these events will be discussed in the following 13 numbered paragraphs.

(1) In response to signal a, counter 2 produces, at an inverting output $C^-$, a signal g that is high except for a pulse that begins when counter 2 has counted its preselected number of cycles as determined by the contents of register 3. In FIG. 5, g is initially is high. As a result of this, output signal h of OR gate 22 is initially high.

(2) The counter makes transitions between successive counter values at each leading edge of oscillator signal a. When counter 2 has counted its preselected number of cycles (as determined by register 3), its output signal g goes low.

(3) Since signal a is high when g goes lows, the output signal $Q^-$ from the $Q^-$ output of D flipflop 12 is low at this event. Because signal $Q^-$ is low when g goes low, OR gate 22 drives its output signal h low.

(4) Since g is low when a goes low, NOR gate 9 drives it output signal b high. This forces the leading edge of the transition in b to occur at a trailing edge of oscillator signal a, thereby synchronizing this transition with the oscillator and making this transition independent of circuit element delays. In addition, since h=0, when a goes to zero, D flipflop 12 drives an output signal A at its output Q low. This also sets countdown counter 2 to the value in register 3.

(5) In response to signal b going high, pulse shaper 4 (consisting of elements 13–16) sets ramp signal r high, thereby inducing Schmitt trigger 16 to make it output signal c go high. While c is high, oscillator 1 is stopped from oscillating.

(6) This low to high transition in signal g occurs at the end of the pulse produced in the ouput of counter 2 that was produced when counter 2 had counted down to zero.

(7) In response to the low to high transition of signal g, OR gate 22 drives signal h low. Likewise, in response to this low to high transition in g, NOR gate 9 drives signal b low.

(8) When ramp signal r drops to some reference level, Schmitt trigger 16 drives signal c low. The duration of the start to the end of the pulse in signal c is determined by the slope of ramp signal r, which in turn is determined by thge digital value input to DAC 14. When the high to low transition in signal c occurs, oscillator 1 begins to oscillate again.

(9) At the end of the first pulse from the oscillator, since signal h is high, in response to the high to low transition in signal a, flipflop 12 drives signal Q high.

(10) Signal 1 at the output of delay line $V_{Z3}$ is the same as signal a, but delayed by an amount determined by this delay line. Signals j and k are the output signals of Comparators 19 and 20, respectively. A pulse is produced in signals j and k, respectively when comparators 19 and 20, respectively, determine that the instantaneous count value in counter 2 is equal to N1 and N2, respectively. In response to the first high to low transition in signal 1 after signal j goes low, NOR gate 10 drives its output signal m high.

(11) When signal j goes high, NOR gate 10 drives its output signal m low.

(12) At the first high to low transition of signal 1 after signal k goes low, since k is low, NOR gate 11 drives its output signal n high.

(13) When signal k goes high, NOR gate 11 drives its output signal n low.

Although transitions in j and k are affected by circuit element delays and are also subject to spurious transitions when the digits in counter 2 do not change simultaneously, by making the transitions in m and n be tied to transitions in signal 1 instead of transitions in signal j and k, these sources of error are removed.

The output of NOR circuit 9 is connected to a ramp generator 13, the ramp end of which is adjustable by means of a digital to analog converter 14.

An input means 15 is used to set the values of registers 3, 14, 17 and 18 and to determine the width of the ramp supplied by generator 13. The digital to analog converter converts this value to an analog signal which determines the decay time of the ramp. The ramp signal is converted by a Schmitt-trigger 16 to the stop pulse c having a pulse width equal to the ramp decay time. Comparators 19 and 20 associated with the registers 17 and 18 compare the contents of the registers with the instantaneous count value of counter 2. In case of equality, a corresponding pulse is applied to NOR gates 10 and 11 respectively, said pulse being supplied to the inputs S and R of RS flipflop 8 via delay lines VZ1 and VZ2 respectively.

The synchronizing means also eliminates spurious effects arising due to timing differences between transitions of different bits of counter 2. Such differences will produce spurious transient values of the value of counter 2. If such a spurious value matches N1 or N2, then a spurious pulse in the output signal of comparator 19 or 20 will occur. The delay introduced by delay line VZ3 is on the order of half an oscillator period. Because of this delay, NOR gates 10 and 11 eliminate such spurious pulses so that these spurious pulses do not show up in signals d and e.

Figure 4:
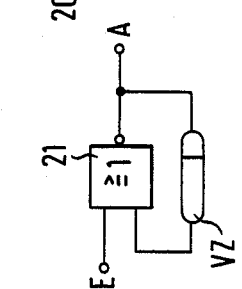
FIG. 4 is a block diagram of a start-stop oscillator utilized in the pulse generator.

FIG. 4 shows a start-stop oscillator suitable for use as oscillator. This oscillator consists of a NOR gate 21 and a delay line VZ. The output A of NOR gate 21 is fed back to one of its two inputs via delay line VZ. The other input E serves as a control input. When input E is at logic "0", oscillation is stopped and when input E is changed to logic "1", oscillation is initiated. Input E is utilized for the input of signal c to oscillator 1. The frequency of this oscillator is determined by delay line VZ.

It is to be understood that the principle of the invention can easily be applied to a pule generator having a plurality of output signals, whereby each of the output signals is adjustable with respect to pulse frequency, pulse width, and pulse delay. Such a multichannel pulse generator using the inventive principle has the advantage that the delay times, relative to each other, of the various output signals can be adjusted very precisely.

What is claimed is:

1. A pulse generator, having an output f that is adjustable with respect to pulse frequency, said generator having an oscillator that produces a plurality of pulses (a) for frequency generation whose output is connected to a frequency dividing unit,
    characterized in that the oscillator is a start/stop oscillator,
    said frequency dividing unit comprises a presettable counter that counts the pulses (a) produced by the oscillator and emits a counter pulse (b) each time a selected count value has been reached, said counter pulse (b) triggering a stop pulse (c) with an adjustable pulse duration determined by adjustable means connected between said counter output and said oscillator,
    said oscillator being shut down during the duration of the stop pulse (c) such that a new counting cycle is started at the end of the stop pulse (c), and
    said pulse frequency of the output signal (f) being determined by both the predetermined count value of said counter and the adjustable duration stop pulse of said adjustable means.

2. A pulse generator as in claim 1,
    characterized in that the instantaneous count values of the counter are compared with a first predetermined nominal value N1 and with a second predetermined nominal value N2,
    that a pulse starting signal (d) is triggered when the count value is equal to the first nominal value N1 and
    that a pulse terminating signal (e) is triggered when the count value is equal to the second nominal value N2, each pulse in output (f) being initiated by a pulse starting signal (d) and terminated by a pulse terminating signal (e).

3. A pulse generator as in claim 2,
    characterized in that the instantaneous count value is applied to a first input of each of a pair of comparators,
    that each comparator has an associated register connected to a second input to compare the instantaneous count value with a stored count value stored in its associated register, and
    that the outputs of said comparators are respectively connected to the set input and the reset input of an RS flipflop via a pair of adjustable delay lines VZ1 and VZ2 respectively, and
    that the output signal (f) is produced at an output Q of the RS flipflop.

4. Pulse generator as in claim 1,
    characterized in that the output of the counter triggers a ramp generator that porduces a ramp signal, said ramp generator including means for continuously adjusting the duration of the ramp signal,
    that the output of said ramp generator is connected to the input of a Schmitt trigger, which delivers a stop pulse (c) at an output.

* * * * *

UNITED STATES PATENT AND TRADEMARK OFFICE
CERTIFICATE OF CORRECTION

PATENT NO. : 4,754,163
DATED : June 28, 1988
INVENTOR(S) : Peter Aue, Michael Fleischer, Friedhelm Brilhaus It is certified that error appears in the above-identified patent and that said Letters Patent is hereby corrected as shown below:

Column 3, line 41, "C-," should read -- $\bar{C}$, --;
Column 5, line 15, "pule" should read --pulse--;
Column 6, line 1, omit "signal (f)";
Column 6, line 34, "porduces" should read --produces--
Column 5, line 38, omit "during the duration" and include "at the leading edge of the stop pulse and is restarted at the trailing edge ... ".

Column 3, line 44, "initially is high" should read --initially high--;
Column 3, line 51, "lows" should be --low--;
Column 3, line 52/3, "Q-" should read -- $\bar{Q}$ --;
Column 3, line 62, "signal A" should read --signal Q--;
Column 3, line 66, "it" should read --its--
Column 4, line 2, "ouput" should read --output--;
Column 4, line 13, "thge" should read --the--.

Signed and Sealed this

Twenty-eighth Day of November 1989

*Attest:*

JEFFREY M. SAMUELS

*Attesting Officer*    Acting Commissioner of Patents and Trademarks